United States Patent
Janesch et al.

(10) Patent No.: US 7,279,988 B1
(45) Date of Patent: Oct. 9, 2007

(54) DIGITAL FREQUENCY LOCKED LOOP AND PHASE LOCKED LOOP FREQUENCY SYNTHESIZER

(75) Inventors: Stephen T. Janesch, Greensboro, NC (US); Eric J. King, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 168 days.

(21) Appl. No.: 11/082,277

(22) Filed: Mar. 17, 2005

(51) Int. Cl.
*H03L 7/00* (2006.01)
(52) U.S. Cl. .......................................... 331/10; 331/17
(58) Field of Classification Search ................ 331/10, 331/17
See application file for complete search history.

(56) References Cited

U.S. PATENT DOCUMENTS

| | | | |
|---|---|---|---|
| 6,072,842 A | 6/2000 | Janesch et al. | 375/326 |
| 6,097,768 A | 8/2000 | Janesch et al. | 375/330 |
| 6,198,353 B1 | 3/2001 | Janesch et al. | 331/16 |
| 6,326,851 B1 | 12/2001 | Staszewski et al. | 331/17 |
| 6,414,555 B2 | 7/2002 | Staszewski et al. | 331/18 |
| 6,429,699 B1 | 8/2002 | Shi et al. | 327/103 |
| 6,504,437 B1 * | 1/2003 | Nelson et al. | 331/14 |
| 6,587,529 B1 | 7/2003 | Staszewski et al. | 375/371 |
| 6,606,004 B2 | 8/2003 | Staszewski et al. | 331/17 |
| 6,650,721 B1 | 11/2003 | Janesch et al. | 375/376 |
| 6,658,748 B1 | 12/2003 | Leipold et al. | 33/179 |
| 6,693,468 B2 | 2/2004 | Humphreys et al. | 327/105 |
| 6,710,664 B2 | 3/2004 | Humphreys et al. | 331/11 |
| 6,724,265 B2 | 4/2004 | Humphreys | 331/17 |
| 6,731,145 B1 | 5/2004 | Humphreys et al. | 327/156 |
| 6,734,741 B2 | 5/2004 | Staszewski et al. | 331/36 C |
| 6,791,422 B2 | 9/2004 | Staszewski et al. | 331/36 C |
| 6,806,786 B1 | 10/2004 | Lam et al. | 331/179 |
| 6,838,951 B1 | 1/2005 | Nieri et al. | 331/177 V |
| 6,851,493 B2 | 2/2005 | Staszewski et al. | 175/376 |

OTHER PUBLICATIONS

Staszewski et al. "A First Multigigahertz Digitally Controlled Oscillator for Wireless Applications," IEEE Transactions on Microwave Theory and Techniques, vol. 51, No. 11, Nov. 2003.

* cited by examiner

*Primary Examiner*—Joseph Chang
(74) *Attorney, Agent, or Firm*—Withrow & Terranova, PLLC

(57) ABSTRACT

A frequency synthesizer including frequency and phase locked loop that operates in either a frequency locked loop (FLL) mode or a phase locked loop (PLL) mode. In a first state, the frequency and phase locked loop operates in the FLL mode for initial frequency acquisition. Once the frequency and phase locked loop has locked in FLL mode, the frequency and phase locked loop transitions to the PLL mode for normal operation.

12 Claims, 4 Drawing Sheets

DIGITAL FREQUENCY LOCKED LOOP AND PHASE LOCKED LOOP FREQUENCY SYNTHESIZER

FIELD OF THE INVENTION

The present invention relates to frequency synthesizers and more particularly relates to a digital frequency and phase locked loop.

BACKGROUND OF THE INVENTION

Conventional frequency synthesizers generally include a phase locked loop (PLL). A PLL is a device which generates an output frequency that is a function of a reference frequency. When implemented in a device such as a wireless transceiver, the output frequency of the PLL changes frequently. For example, the output frequency of the PLL changes at start-up and when changing channels. In each of these situations, it is desirable for the PLL to settle as quickly as possible. Further, in frequency hopping spread spectrum (FHSS) transceivers, the output frequency of the PLL changes for each frequency hop. Thus, the PLL is required to have an even faster settling time in order to comply with the timing requirements of the frequency hopping transceiver.

In conventional PLL's there is a trade off between settling time and phase noise, which are both a function of the bandwidth of a low-pass filter in the PLL. Thus, a designer may be forced to select a bandwidth for the low-pass filter that meets the phase noise requirements while providing a less than desirable settling time. Thus, there remains a need for a frequency synthesizer that avoids the tradeoff between settling time and phase noise and that has a reduced settling time.

SUMMARY OF THE INVENTION

The present invention provides a frequency synthesizer including frequency and phase locked loop that operates in either a frequency locked loop (FLL) mode or a phase locked loop (PLL) mode. In a first state, the frequency and phase locked loop operates in the FLL mode for initial frequency acquisition. Once the frequency and phase locked loop has locked in FLL mode, the frequency and phase locked loop transitions to the PLL mode for normal operation.

The frequency and phase locked loop includes a controlled oscillator generating an output frequency based on a control signal. Feed-back circuitry receives the output frequency and provides a feed-back phase based on the output frequency. First selection circuitry receives a reference frequency and a mode control signal, generates a reference phase based on the reference frequency, and provides the reference frequency when the mode control signal is in the first state and the reference phase when the mode control signal is in a second state. Second selection circuitry receives the feed-back phase and the mode control signal, generates a feed-back frequency based on the feed-back phase, and provides a feed-back frequency when the mode control signal is in the first state and the feed-back phase when the mode control signal is in the second state. A frequency and phase detector receives either the reference frequency and the feed-back frequency or the reference phase and the feed-back phase and generates an error signal based on the difference between the reference frequency and the feed-back frequency or the reference phase and the feed-back phase. A loop filter receives the error signal and provides the control signal to the controlled oscillator based on the error signal.

In one embodiment, the loop filter is a digital loop filter including an integrating and a proportional path. The integrating path includes an amplifier having a gain controlled by a first gain control signal. Similarly, the proportional path includes an amplifier having a gain controlled by a second gain control signal. The first and second gain control signals are provided to control the gain of the amplifiers and thus the bandwidth of the loop filter.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
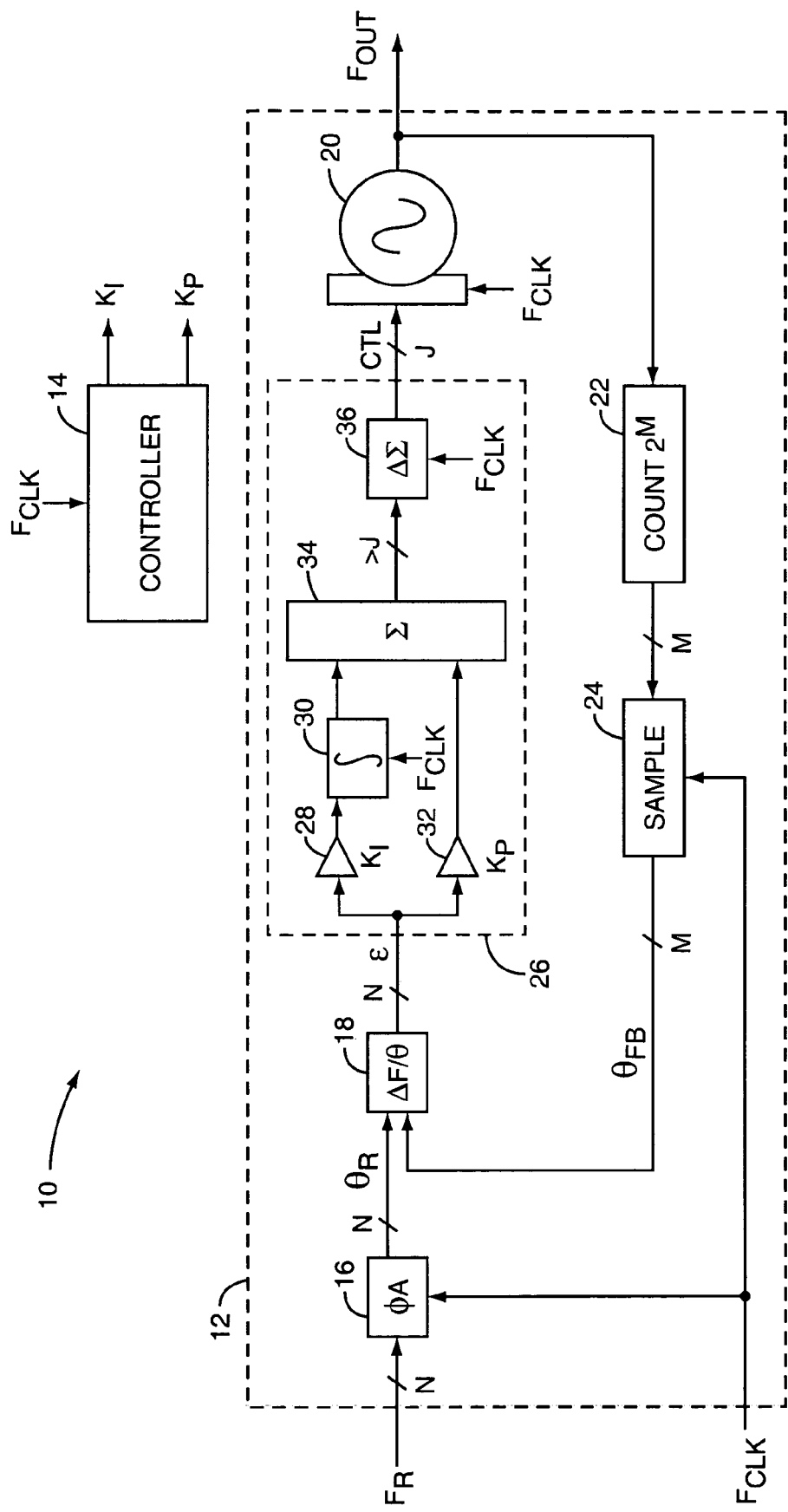
FIG. 1 illustrates a frequency synthesizer of the present invention wherein the frequency and phase locked loop operates as a digital phase locked loop.
Figure 3:
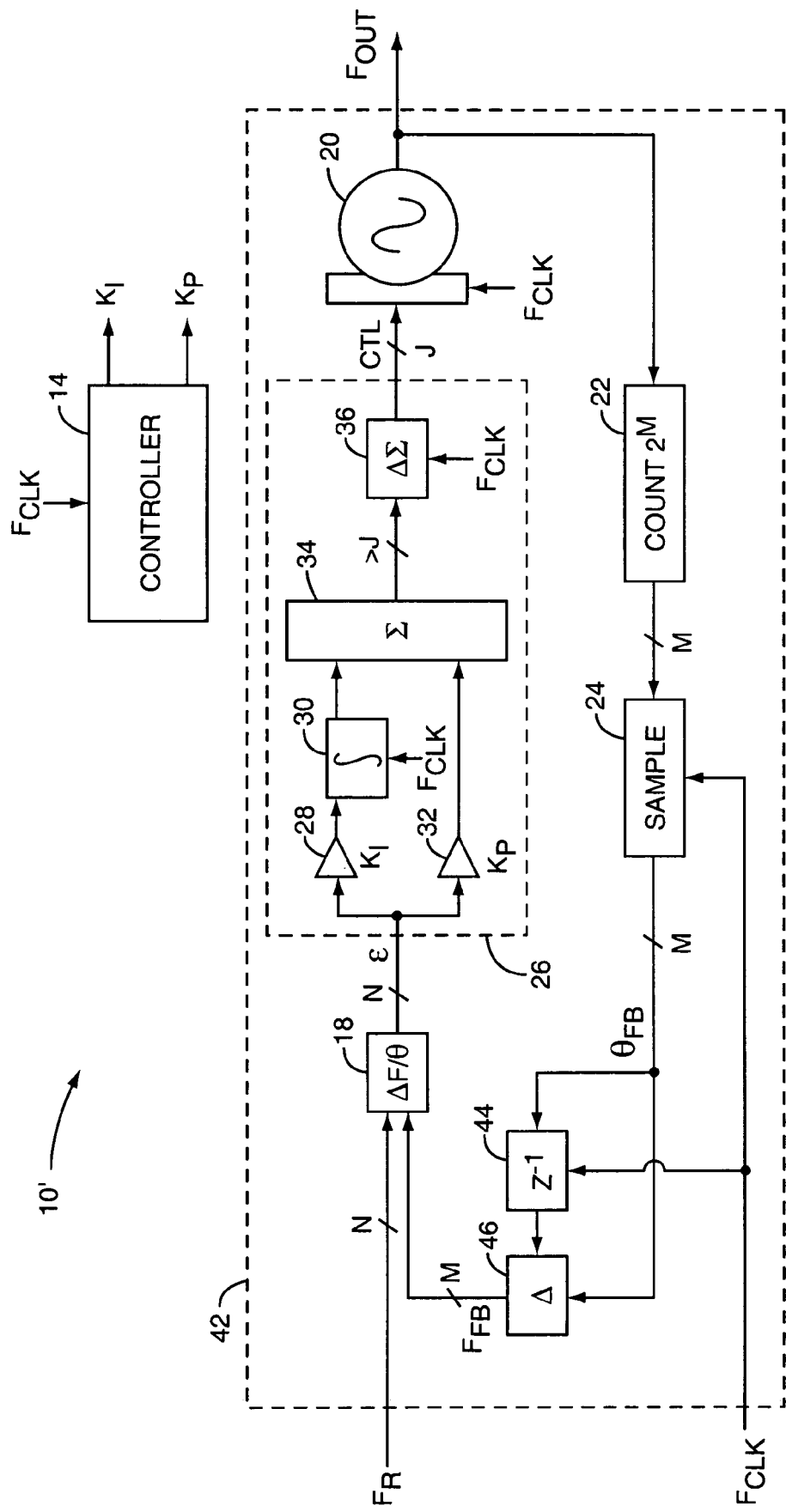
FIG. 3 illustrates a frequency synthesizer of the present invention wherein the frequency and phase locked loop operates as a digital frequency locked loop.
Figure 4:
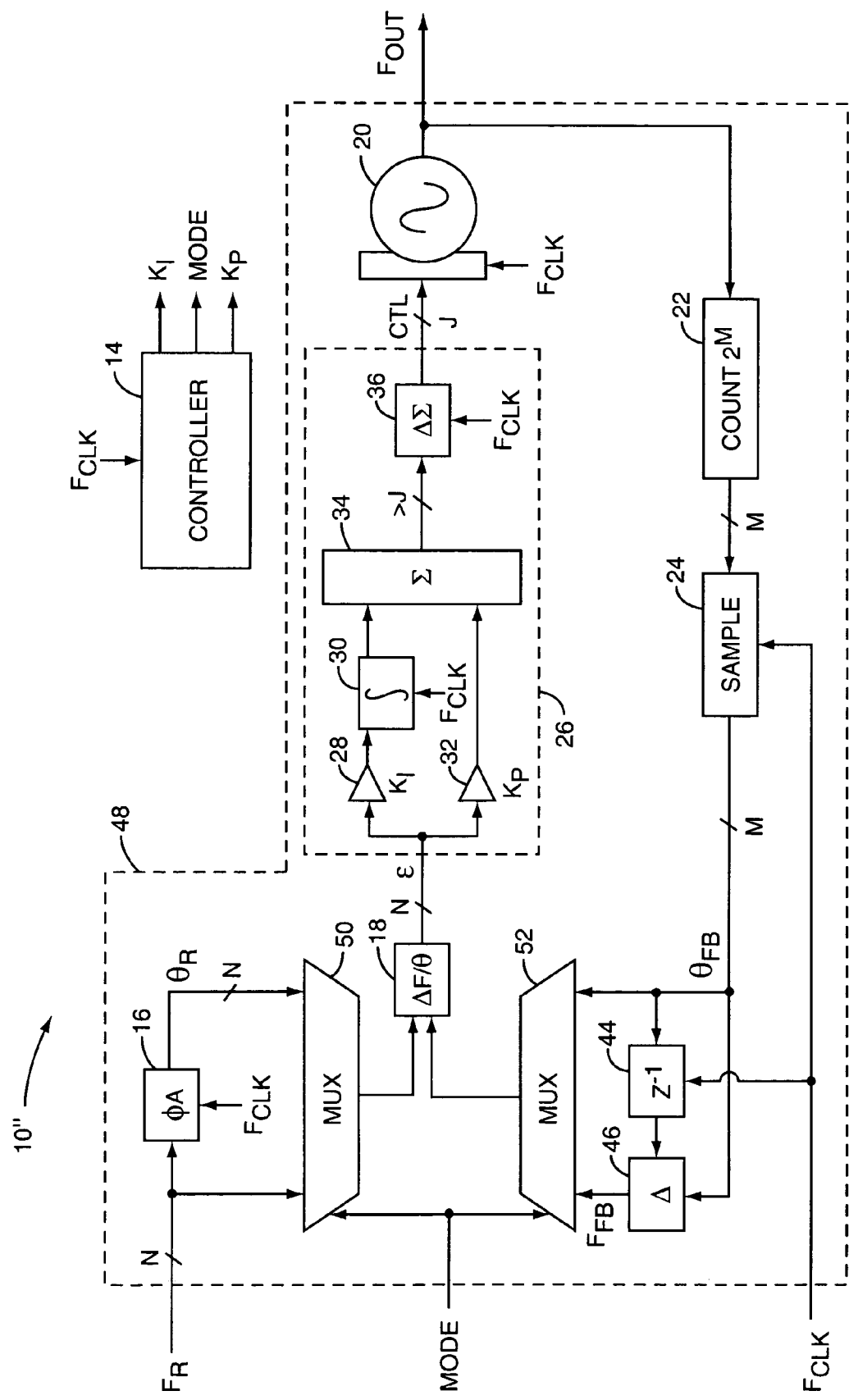
FIG. 4 illustrates a frequency synthesizer including an all digital frequency and phase locked loop according to one embodiment of the present invention.

The present invention provides a frequency synthesizer including a frequency and phase locked loop that operates either a phase locked loop (PLL) or a frequency locked loop (FLL) based on a mode control signal. FIG. 1 illustrates the operation of the frequency and phase locked loop of the present invention when in a PLL mode. FIG. 3 illustrates the operation of the frequency and phase locked loop of the present invention when in a FFL mode, and FIG. 4 illustrates the frequency and phase locked loop of the present invention that operates in either the PLL mode or the FLL mode depending on the mode control signal.

FIG. 1 illustrates a frequency synthesizer 10 of the present invention wherein the frequency and phase locked loop operates as a digital phase locked loop (PLL) 12. As illustrated, the frequency synthesizer 10 also includes a controller 14. However, it should be noted that the controller 14 may alternatively be an external controller of a device such as a mobile communication device. The PLL 12 includes a phase accumulator 16, a frequency or phase detector 18, a digitally controlled oscillator (DCO) 20, an M-bit counter 22, sampling circuitry 24, and a digital loop filter 26. The phase accumulator 16 is clocked at a clock frequency ($F_{CLK}$) and receives a reference frequency ($F_R$), which is an N-bit digital word, and produces an N-bit digital word corresponding to a reference phase ($\theta_R$). The reference frequency ($F_R$) is supplied by external circuitry such as a controller of a wireless transceiver. The reference phase ($\theta_R$) is a discrete time instantaneous phase of a tone with frequency ($F_R/2^N$)*$F_{CLK}$. The phase or frequency detector 18 operates as either a phase detector or a frequency detector depending on its inputs. As illustrated, the phase or frequency detector 18 receives the reference phase ($\theta_R$) and a feed-back phase ($\theta_{FB}$). The feed-back phase ($\theta_{FB}$) is generated by feed-back circuitry based on an output frequency ($F_{OUT}$) from the DCO 20. In this embodiment, the feed-back circuitry includes the M-bit counter 22 and the sampling circuitry 24. The output frequency ($F_{OUT}$) clocks the M-bit counter 22 whose output is sampled at the clock frequency ($F_{CLK}$) by the sampling circuitry 24. The output of the sampling circuitry 24 is the feed-back phase ($\theta_{FB}$), which is an M-bit word defined as:

$$\theta_{FB} = \frac{F_{OUT} \times t}{2^M},$$

where t is time.

Based on the reference phase ($\theta_R$) and the feed-back phase ($\theta_{FB}$), the phase or frequency detector 18 generates an error signal ($\epsilon$). The error signal ($\epsilon$) is an N-bit word corresponding to a difference between the reference phase ($\theta_R$) and the feed-back phase ($\theta_{FB}$). Thus, the phase or frequency detector 18 operates to provide the difference between the reference phase ($\theta_R$) and the feed-back phase ($\theta_{FB}$) by subtracting. Since the reference phase ($\theta_R$) is an N-bit word and the feed-back phase ($\theta_{FB}$) is an M-bit word, the feed-back phase ($\theta_{FB}$) has (N-M) LSBs with zero value appended to it, to match the width of the reference phase ($\theta_R$). It should also be noted that the reference phase ($\theta_R$) and the feed-back phase ($\theta_{FB}$) are unsigned, cyclic numbers. However, the error signal ($\epsilon$) is a signed number because phase error can be positive or negative. Further, the PLL 12 operates to drive the error signal ($\epsilon$) to zero.

The error signal ($\epsilon$) is provided to the digital loop filter 26. The loop filter 26 operates to provide a digital control signal (CTL) having J bits to the DCO 20. In this embodiment, the digital loop filter 26 includes a first amplifier 28, an integrator 30, a second amplifier 32, summation circuitry 34, and a delta-sigma modulator 36. In this embodiment, the first amplifier 28 and the integrator 30 form an integrating path, and the second amplifier 32 forms a proportional path. In the integrating path, the error signal ($\epsilon$) is amplified by the first amplifier 28 and integrated by the integrator 30. A gain ($K_I$) of the first amplifier 28 is controlled by the controller 14. In the proportional path, the error signal ($\epsilon$) is amplified by the second amplifier 32, where a gain ($K_P$) of the second amplifier 32 is also controlled by the controller 14. By controlling the gains $K_I$ and $K_P$, the controller 14 controls the bandwidth of the PLL 12.

The outputs of the integrator 30 and the second amplifier 32 are added by the summation circuitry 34. The output of the summation circuitry 34 is a digital word having a number of bits greater than J, where J is the number of bits in the control signal (CTL) provided to the DCO 20. The delta-sigma modulator 36 operates to truncate the least significant bits of the output of the summation circuitry 34 and provide the J-bit control signal (CTL) to the DCO 20. The delta-sigma modulator 36 also operates to reduce tones generated by quantization when truncating the least significant bits of the output of the summation circuitry 34 by spreading the energy of the tones into noise.

Based on the control signal (CTL), the DCO 20 generates the output frequency ($F_{OUT}$). In one embodiment, the DCO 20 is a digitally variable LC oscillator that is tuned by switching binary valued, binary weighted varactors in a tank (not shown) of the DCO 20 using the control signal (CTL). In general, control of the DCO may be achieved by varying the capacitance of an LC tank using varactors or switched capacitors, or changing other characteristics of the DCO by altering its bias current or voltage. Once the PLL 12 has settled, the output frequency ($F_{OUT}$) is defined as:

$$F_{OUT} = \frac{F_R \times F_{CLK}}{2^{(N-M)}}.$$

It should be noted that M is any integer such that $2^M$ is greater than a ratio of a maximum output frequency ($F_{OUT, MAX}$), which is the maximum output frequency ($F_{OUT}$) that the DCO 20 is capable of generating, to the clock frequency ($F_{CLK}$).

Figure 2:
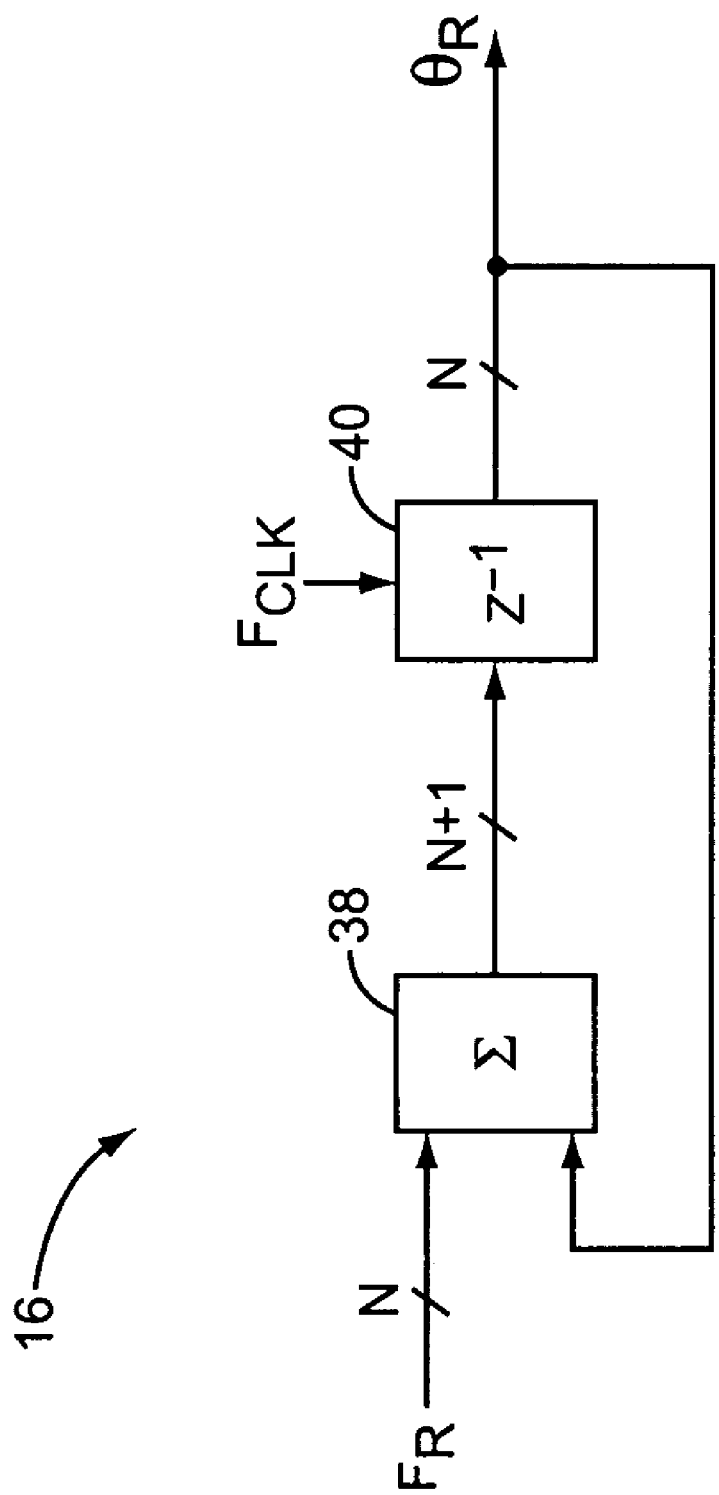
FIG. 2 illustrates a phase accumulator according to one embodiment of the present invention.

FIG. 2 illustrates the phase accumulator 16 according to one embodiment of the present invention. In this embodiment, the phase accumulator 16 includes summation circuitry 38 and a register 40. The summation circuitry 38 receives the N-bit reference frequency ($F_R$) digital word and the reference phase ($\theta_R$) from the output of the register 40. The output of the summation circuitry 38 is an N+1 bit digital word that is stored in the register 40. The output of the register 40, and thus the reference phase ($\theta_R$), is updated at the clock frequency ($F_{CLK}$).

The operation of the phase accumulator 16 is best understood by first noting that the phase of the output frequency ($F_{OUT}$) increases each clock by a step proportional to the output frequency ($F_{OUT}$) and wraps around at one full cycle. Thus, in order for the phase or frequency detector 18 to accurately generate the error signal ($\epsilon$), the phase accumulator 16 operates to increase the reference phase ($\theta_R$) in a similar fashion. The reference phase ($\theta_R$) begins at zero and increases at each clock by a step proportional to the reference frequency ($F_R$). The reference phase ($\theta_R$) increases up to $2\pi$ and then wraps around.

FIG. 3 illustrates the operation of the frequency synthesizer 10' of the present invention where the frequency and phase locked loop operates as a frequency locked loop (FLL) 42. As illustrated, the frequency synthesizer 10' also includes a controller 14. However, it should be noted that the controller 14 may alternatively be an external controller of a device such as a mobile communication device. The FLL 42 is similar to the PLL 12 of FIG. 1 and includes the phase or frequency detector 18, the DCO 20, the M-bit counter 22, the sampling circuitry 24, and the digital loop filter 26. The FLL 42 also includes a register 44 and difference circuitry 46 which form a phase-to-frequency converter and operate to convert the feed-back phase ($\theta_{FB}$) into a feed-back frequency ($F_{FB}$), where the feed-back frequency ($F_{FB}$) is an M-bit digital word.

In the FLL 42, the phase or frequency detector 18 receives the reference frequency ($F_R$) digital word and the feed-back frequency ($F_{FB}$) and provides the error signal ($\epsilon$) based on a difference between the reference frequency ($F_R$) and the feed-back frequency ($F_{FB}$). As discussed above, the loop filter 26 receives the error signal ($\epsilon$) and provides the J-bit control signal (CTL) to the DCO 20, and the DCO 20 generates the output frequency ($F_{OUT}$) based on the control signal (CTL). It should be noted that for the FLL 42, the gain $K_P$ of the amplifier 32 in the proportional path of the loop filter 26 is set to zero. Alternatively, the loop filter 26 may not include the amplifier 32 when implemented as part of the FLL 42. The output frequency ($F_{OUT}$) clocks the M-bit counter 22 whose output is sampled at the clock frequency ($F_{CLK}$) by the sampling circuitry 24. The output of the sampling circuitry 24 is the feed-back phase ($\theta_{FB}$).

The feed-back phase ($\theta_{FB}$) is converted to the feed-back frequency ($F_{FB}$) by the register 44 and the difference circuitry 46. The operation of the register 44 and the difference circuitry 46 is best understood by first noting that frequency can be defined as change in phase over time. Thus, the register 44 and the difference circuitry 46 operate to provide the feed-back frequency ($F_{FB}$) based on the change in the feed-back phase ($\theta_{FB}$) over time. More particularly, the difference circuitry 46 provides the feed-back frequency ($F_{FB}$) by determining a difference between a current value of the feed-back phase ($\theta_{FB}$) and a previous value of the feed-back phase ($\theta_{FB}$). The register 44 operates to provide the previous value of the feed-back phase ($\theta_{FB}$). In general, during each cycle of the clock frequency ($F_{CLK}$), the register 44 stores the current value of the feed-back phase ($\theta_{FB}$) and provides the previous value of the feed-back phase ($\theta_{FB}$) at its output.

FIG. 4 illustrates the frequency synthesizer 10" including a frequency and phase locked loop 48 according to one embodiment of the present invention. The frequency and phase locked loop 48 operates as either a PLL like the PLL 12 of FIG. 1 or a FLL like the FLL 42 of FIG. 3 depending on a mode control signal (MODE) from the controller 14. The frequency and phase locked loop 48 includes all of the elements of the PLL 12 of FIG. 1 and of the FLL 42 of FIG. 3. In addition, the frequency and phase locked loop 48 includes multiplexers 50 and 52. The first multiplexer 50 receives the reference frequency ($F_R$) and the reference phase ($\theta_R$) and provides either the reference frequency ($F_R$) or the reference phase ($\theta_R$) based on the mode control signal (MODE). The second multiplexer 52 receives the feed-back frequency ($F_{FB}$) and the feed-back phase ($\theta_{FB}$) and provides either the feed-back frequency ($F_{FB}$) or the feed-back phase ($\theta_{FB}$) based on the mode control signal (MODE).

When the mode control signal (MODE) is in a PLL state, the frequency and phase locked loop 48 operates in a PLL mode. Accordingly, the first multiplexer 50 provides the reference phase ($\epsilon_R$) and the second multiplexer 52 provides the feed-back phase ($\theta_{FB}$). When in the PLL mode, the frequency and phase locked loop 48 operates as the PLL 12 of FIG. 1. When the mode control signal (MODE) is in a FLL state, the frequency and phase locked loop 48 operates in a FLL mode. Accordingly, the first multiplexer 50 provides the reference frequency ($F_R$) and the second multiplexer 52 provides the feed-back frequency ($F_{FB}$). When in the FLL mode, the frequency and phase locked loop 48 operates as the FLL 42 of FIG. 3.

The operation of the frequency and phase locked loop 48 is best described by starting at a point where the reference frequency ($F_R$) has just changed. In general, the frequency synthesizer 10" operates in the FLL mode for initial frequency acquisition and switches to the PLL mode for normal operation. More specifically, when the reference frequency ($F_R$) changes or upon start-up of the frequency synthesizer 10", the controller 14 generates the mode control signal (MODE) such that the frequency and phase locked loop 48 is in FLL mode. It should be noted that any time the mode of the frequency and phase locked loop 48 is switched, the reference phase $\theta_R$ and the feed-back phase $\theta_{FB}$ are set equal to one another and may further be set equal to zero in order to avoid introducing unnecessary error. This may be accomplished by loading the value of the feed-back phase $\theta_{FB}$ into the reference phase accumulator 16, or by loading the M most significant bits of the reference phase $\theta_R$ into the M-bit counter 22. The controller 14 also generates the gains $K_I$ and $K_P$ for the amplifiers 28 and 32 in the loop filter 26. The gain $K_P$ is set to zero when in FLL mode, and the gain $K_I$ is selected such that the loop filter 26 has the desired bandwidth. The advantage of performing initial acquisition in FLL mode is that the frequency and phase locked loop 48 is a first order loop and unconditionally stable at all bandwidths when in FLL mode. Further, initial frequency acquisition in the FLL mode occurs rapidly and reduces the overall settling time of the frequency synthesizer 10".

Once the frequency and phase locked loop 48 has locked on the reference frequency ($F_R$) in FLL mode, the controller 14 switches the mode control signal (MODE) to its PLL state such that the frequency and phase locked loop 48 switches to PLL mode. As stated above, upon switching, the reference phase $\theta_R$ and the feed-back phase $\theta_{FB}$ are set equal to one another and may further be set equal to zero in order to avoid introducing unnecessary error. The controller 14 also generates the gains $K_I$ and $K_P$ for the amplifiers 28 and 32 in the loop filter 26 such that the loop filter 26 has the desired bandwidth. The frequency and phase locked loop 48 locks on the reference frequency ($F_R$) in PLL mode and remains in PLL mode until the reference frequency ($F_R$) changes.

While in PLL mode, the controller may change the bandwidth of the loop filter 26 any number of times to provide the desired settling time and to reduce phase noise. Because the bandwidth of the loop filter 26 can be changed during operation, the tradeoff between fast settling time and phase noise associated with conventional PLL's can be avoided. For example, once in PLL mode, the controller 14 may provide the gains $K_I$ and $K_P$ for the amplifiers 28 and 32 in the loop filter 26 such that the frequency and phase locked loop 48 operates in a wide bandwidth PLL mode. Once the frequency and phase locked loop 48 has locked on the reference frequency ($F_R$) in the wide bandwidth PLL mode, the controller 14 may change the gains $K_I$ and $K_P$ for the amplifiers 28 and 32 in the loop filter 26 such that the frequency and phase locked loop 48 operates in a narrow bandwidth PLL mode. The frequency and phase locked loop 48 continues to operate in the narrow bandwidth PLL mode until the reference frequency ($F_R$) changes. By first operating in the wide bandwidth PLL mode and then in the narrow bandwidth PLL mode, the overall settling time of the frequency synthesizer 10" is further reduced.

Those skilled in the art will recognize improvements and modifications to the preferred embodiments of the present invention. All such improvements and modifications are considered within the scope of the concepts disclosed herein and the claims that follow.

What is claimed is:
1. A frequency synthesizer comprising:
a frequency and phase locked loop adapted to receive a mode control signal and to operate in a frequency locked loop (FLL) mode when the mode control signal is in a first state and in a phase locked loop (PLL) mode when the mode control signal is in a second state, wherein the frequency and phase locked loop comprises:
a controlled oscillator adapted to provide an output frequency based on a control signal;
feed-back circuitry adapted to receive the output frequency and provide a feed-back phase;
first circuitry adapted to receive a reference frequency and the mode control signal and provide the reference frequency when the mode control signal is in the first state and provide a reference phase when the mode control signal is in the second state, wherein the reference phase is provided based on the reference frequency;
second circuitry adapted to receive the feed-back phase and the mode control signal and provide a feed-back frequency when the mode control signal is in the first state and provide the feed-back phase when the mode control signal is in the second state, wherein the feed-back frequency is provided based on the feed-back phase;
a frequency and phase detector adapted to receive either the reference frequency and the feed-back frequency or the reference phase and the feed-back phase and generate an error signal based on a difference between the reference frequency and the feed-back frequency or the reference phase and the feed-back phase; and
a loop filter adapted to receive the error signal and provide the control signal based on the error signal.

2. The frequency synthesizer of claim 1 wherein the frequency and phase locked loop is an all digital circuit.

3. The frequency synthesizer of claim 2 wherein the controlled oscillator is a digitally controlled oscillator.

4. The frequency synthesizer of claim 2 wherein the reference frequency is a digital control word.

5. The frequency synthesizer of claim 2 wherein the loop filter is a digital loop filter comprising at least one amplifier having a gain controlled by a gain control signal.

6. The frequency synthesizer of claim 5 further comprising a controller adapted to provide the gain control signal to the at least one amplifier in the digital loop filter, thereby controlling a bandwidth of the digital loop filter.

7. The frequency synthesizer of claim 2 wherein the first circuitry comprises:
a phase accumulator adapted to receive the reference frequency and provide the reference phase based on the reference frequency, wherein the reference frequency is a digital control word; and
multiplexing circuitry adapted to receive the reference frequency, the reference phase, and the mode control signal and provide the reference frequency when the mode control signal is in the first state and provide the reference phase when the mode control signal is in the second state.

8. The frequency synthesizer of claim 2 wherein the second circuitry comprises:
a phase-to-frequency converter adapted to receive the feed-back phase from the feed-back circuitry and provide the feed-back frequency based on the feed-back phase; and
multiplexing circuitry adapted to receive the feed-back frequency, the feed-back phase, and the mode control signal and provide the feed-back frequency when the mode control signal is in the first state and provide the feed-back phase when the mode control signal is in the second state.

9. The frequency synthesizer of claim 8 wherein the phase-to-frequency converter comprises:
a register adapted to receive a current value of the feed-back phase and provide a previous value of the feed-back phase; and
difference circuitry adapted to provide the feed-back frequency based on a difference between the current value of the feed-back phase and the previous value of the feed-back phase.

10. The frequency synthesizer of claim 2 wherein the feed-back circuitry comprises:
counter circuitry clocked by the output frequency; and
sampling circuitry adapted to sample an output signal from the counter circuitry and provide the feed-back phase.

11. A method generating a frequency comprising:
operating a frequency and phase locked loop adapted to operate in a frequency locked loop (FLL) mode or a phase locked loop (PLL) mode based on a mode control signal in the FLL mode when the mode control signal is in a first state; and
operating the frequency and phase locked loop in the PLL mode when the mode control signal is in a second state, further comprising:
generating an output frequency based on a control signal;
generating a feed-back phase based on the output frequency;
generating a feed-back frequency based on the feed-back phase;
receiving a reference frequency;
generating a reference phase based on the reference frequency;
providing the reference frequency and the feed-back frequency when the mode control signal is in the first state;
providing the reference phase and the feed-back phase when the mode control signal is in the second state;
generating an error signal based on a difference between either the reference frequency and the feed-back frequency or the reference phase and the feed-back phase;
filtering the error signal to provide the control signal.

12. The method of claim 11 wherein the reference frequency is a digital control word.

* * * * *